United States Patent
Maruyama

(10) Patent No.: US 7,323,960 B2
(45) Date of Patent: Jan. 29, 2008

(54) ELECTROMAGNETOSTRICTIVE ACTUATOR

(75) Inventor: Teruo Maruyama, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/898,291

(22) Filed: Jul. 26, 2004

(65) Prior Publication Data

US 2005/0001704 A1  Jan. 6, 2005

Related U.S. Application Data

(62) Division of application No. 09/967,925, filed on Oct. 2, 2001, now abandoned.

(30) Foreign Application Priority Data

Oct. 3, 2000 (JP) ............................ 2000-303337

(51) Int. Cl.
H01F 7/00 (2006.01)
H01H 55/00 (2006.01)
(52) U.S. Cl. .................. 335/215; 251/129.06
(58) Field of Classification Search ................ 332/215; 251/129.06; 310/26
See application file for complete search history.

(56) References Cited

U.S. PATENT DOCUMENTS

| | | | |
|---|---|---|---|
| 5,184,037 A | 2/1993 | Kobayashi et al. ........... 310/26 |
| 5,553,742 A * | 9/1996 | Maruyama et al. ............ 222/1 |
| 5,803,056 A | 9/1998 | Cook et al. ................. 123/520 |
| 5,865,572 A * | 2/1999 | Kress et al. .................. 408/36 |
| 5,868,375 A | 2/1999 | Reinicke et al. ....... 251/129.21 |
| 5,901,690 A | 5/1999 | Hussey et al. ......... 123/568.26 |
| 6,249,367 B1 * | 6/2001 | Hirose ....................... 359/210 |
| 6,279,842 B1 * | 8/2001 | Spain ...................... 239/585.1 |
| 6,345,937 B1 * | 2/2002 | Kress et al. ................ 408/1 R |
| 6,433,991 B1 | 8/2002 | Deaton et al. ............. 361/191 |
| 6,558,127 B2 * | 5/2003 | Maruyama et al. ........ 417/44.1 |
| 6,561,436 B1 | 5/2003 | Boecking ................. 239/102.2 |
| 6,565,333 B2 | 5/2003 | Maruyama .................. 417/417 |
| 6,624,539 B1 | 9/2003 | Hansen et al. ................ 310/26 |
| 6,758,408 B2 * | 7/2004 | Czimmek ....................... 239/5 |
| 2003/0057394 A1 | 3/2003 | Makino .................. 251/129.06 |
| 2003/0084844 A1 | 5/2003 | Yamauchi et al. .......... 118/663 |

OTHER PUBLICATIONS

"Research on Small-Diameter Hole Processing with Oscillation Superimposed on Feed" by Hidetaka Kubota et al., pp. 1006-1009, vol. 61, No. 7, 1995 of The Journal of Japan Society for Precision Engineering.

* cited by examiner

Primary Examiner—Elvin Enad
Assistant Examiner—Bernard Rojas
(74) Attorney, Agent, or Firm—Wenderoth, Lind & Ponack, L.L.P.

(57) ABSTRACT

An actuator includes an electromagnetostrictive element that has one end located on a front side and the other end located on a rear side. An output shaft penetrates the electromagnetostrictive element and is pressurized toward the rear side of the electromagnetostrictive element. A housing houses therein the electromagnetostrictive element and the output shaft, and bearing portions respectively support the front side and the rear side of the output shaft. A bias spring is provided between the rear side of the output shaft and the housing, and a displacement sensor detects a position in an axial direction of the shaft.

6 Claims, 8 Drawing Sheets

ELECTROMAGNETOSTRICTIVE ACTUATOR

This is a divisional application of Ser. No. 09/967,925 filed Oct. 2, 2001, now abandoned.

BACKGROUND OF THE INVENTION

The present invention relates to micro actuators necessary for information and precision instruments, machine tools, and FA (Factory Automation) and other fields or various production processes of semiconductors, LCD's, display devices, surface mounting, and the like.

The machining accuracy in machining processes is improving from the micron order to the submicron order. Although the submicron processing is usual in the fields of semiconductor and electronic components, there is also a growing demand for ultraprecision machining in the field of machining that is developing together with mechatronics. One of the reasons for enabling the ultraprecision machining is the introduction of a high-precision measurement technology utilizing laser, which can easily measure the displacement on the nanometer order.

Furthermore, electromagnetostrictive elements represented by a Giant-magnetostrictive element and a piezoelectric element have been recently used as a micro actuator together with the introduction of the high-precision measurement technology.

With the discovery of giant magnetostriction at a very low temperature in 1963 as a start, the Giant-magnetostrictive material reputed to be invented chiefly by A. E. Clark in 1972 has recently been promptly put into practical use because the material can obtain a giant magnetostriction two orders of magnitude greater than the conventional magnetostrictive material even at normal temperature.

A typical material has a composition including a rare earth element R and iron Fe at an atom ratio of 1:2, and these include, for example, $TbFe_2$, $DyFe_2$, $SmFe_2$, $HoFe_2$, and $ErFe_2$.

In contrast to the fact that the conventional magnetostrictive material has a magnetostriction of several tens of parts per million, the Giant-magnetostrictive material can obtain 1500 to 2000 PPM (magnetostriction: $PPM=\Delta L/L \times 10^6$).

FIG. 12 shows the representative structure of a direct-acting type actuator that employs this Giant-magnetostrictive bulk material, including a Giant-magnetostrictive rod 700, a magnetic field coil 701, a bias permanent magnet 702, a yoke member 704, an output shaft 705, and a bias spring 706.

The bias permanent magnet 702 is arranged so as to boost the operating point of the magnetic field by preliminarily applying a magnetic field to the rod 700 and widen the range of linearity of Giant-magnetostriction with respect to the intensity of the magnetic field. The bias spring 706 is provided for making the slope of magnetostriction steep with respect to the magnetic field by preliminarily applying an appropriate preload (compressive stress) to the rod 700.

The Giant-magnetostrictive actuator has the features of (1) large displacement magnitude, (2) low-voltage drive, (3) high-speed response, (4) large generated load, and (5) non-contact drive capability.

The laminate type piezoelectric element, which has had a comparatively long history and is compared with the Giant-magnetostrictive element, is widely used as a micro actuator for a precision positioning apparatus and so on. However, the aforementioned features (2) and (5) are features of the Giant-magnetostrictive element, but are not owned by the piezoelectric element.

The commodities of OA (Office Automation) and AV (Audio Visual) uses, information equipment, and so on have recently been developed to have decreasing weights and sizes, and micro and fine production technologies have been required for the manufacturing of the commodities. For example, accurate positioning, accurate linear conveyance, a high-speed feeder of small components, very minute flow rate control, and so on are required. The key to the development of these technologies is a high-performance micro actuator.

Actuators are employed not only for uniaxial operation but also as a mechanical unit capable of operating in a complex manner with a high degree of freedom and are also desired to have high accuracy and high response.

The electromagnetostrictive elements such as the Giant-magnetostrictive element and the piezoelectric element can be regarded as idealistic actuators since they have the aforementioned features if their uniaxial characteristics are evaluated.

However, if an apparatus is constructed by combining a plurality of electromagnetostrictive actuators in order to achieve the operation with a high degree of freedom, then the entire apparatus including the control system becomes complicated. Therefore, it is practically difficult to adopt the above construction.

SUMMARY OF THE INVENTION

An object of the present invention is to provide an actuator which can prevent the entire apparatus including the control system from becoming complicated while achieving operation with a high degree of freedom.

In accomplishing these and other aspects, according to a first aspect of the present invention, there is provided an actuator comprising: an electromagnetostrictive element that has one end located on a front side and the other end located on a rear side; an output shaft that penetrates the electromagnetostrictive element and is pressurized (biased) toward the rear side of the electromagnetostrictive element; a housing that houses therein the electromagnetostrictive element and the output shaft; bearing portions that respectively support the front side and the rear side of the output shaft; a bias spring provided between the rear side of the output shaft and the housing; and a displacement sensor that detects a position in an axial direction of the shaft.

According to a second aspect of the present invention, there is provided an actuator comprising an electromagnetostrictive element that has one end located on a front side and the other end located on a rear side; a first output shaft that penetrates the electromagnetostrictive element and is pressurized toward the rear side of the electromagnetostrictive element; a housing that houses therein the electromagnetostrictive element and the first output shaft; a second output shaft that houses therein the front side of the first output shaft and is pressurized toward the front side of the electromagnetostrictive element; and bearing portions that respectively support the rear side of the first output shaft and the second output shaft.

According to a third aspect of the present invention, there is provided an actuator as defined in the second aspect, further comprising bias springs provided between the rear side of the first output shaft and the housing and between the second output shaft and the housing.

According to a fourth aspect of the present invention, there is provided an actuator comprising an electromagnetostrictive element that has one end located on a front side and the other end located on a rear side; a first output shaft that penetrates the electromagnetostrictive element and is pressurized toward the rear side of the electromagnetostrictive element; a housing that houses therein the electromagnetostrictive element and the first output shaft; a rear-side sleeve that rotatably supports the rear side of the first output shaft; a second output shaft that houses therein the front side of the first output shaft and is pressurized toward the front side of the electromagnetostrictive element; a front-side sleeve that rotatably supports the second output shaft; and a device for making the first output shaft and/or the second output shaft movable in the axial direction and rotating either one of the first output shaft and the second output shaft.

According to a fifth aspect of the present invention, there is provided an actuator as defined in the fourth aspect, wherein the first output shaft and the second output shaft are able to move relative to each other in the axial direction and to mutually transmit the rotation thereof.

According to a sixth aspect of the present invention, there is provided an actuator comprising an electromagnetostrictive element that has one end located on a front side and the other end located on a rear side; a rear-side center shaft pressurized toward the rear side of the electromagnetostrictive element; a rear-side bearing portion provided between the rear-side center shaft and the housing to make the rear-side center shaft rotatable relative to the housing; an output shaft pressurized toward the front side of the electromagnetostrictive element; a front-side sleeve that rotatably supports the output shaft relative to the housing; and a front-side bearing portion that rotatably supports the output shaft rotatably relative to the housing and movably in the axial direction.

According to a seventh aspect of the present invention, there is provided an actuator as defined in the sixth aspect, further comprising a rotation transmission shaft capable of moving relatively in the axial direction and mutually transmitting rotation, and which is provided between the front side and the rear side of the electromagnetostrictive element.

According to an eighth aspect of the present invention, there is provided an actuator as defined in the fifth aspect, further comprising a bias spring provided between the output shaft and the front-side sleeve.

According to a ninth aspect of the present invention, there is provided an actuator as defined in the fourth aspect, wherein the electromagnetostrictive element is a Giant-magnetostrictive element.

According to a 10th aspect of the present invention, there is provided an actuator as defined in the fifth aspect, wherein the electromagnetostrictive element is a Giant-magnetostrictive element.

According to an 11th aspect of the present invention, there is provided an actuator as defined in the sixth aspect, wherein the electromagnetostrictive element is a Giant-magnetostrictive element.

According to a 12th aspect of the present invention, there is provided an actuator as defined in the seventh aspect, wherein the electromagnetostrictive element is a Giant-magnetostrictive element.

According to a 13th aspect of the present invention, there is provided an actuator as defined in the eighth aspect, wherein the electromagnetostrictive element is a Giant-magnetostrictive element.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
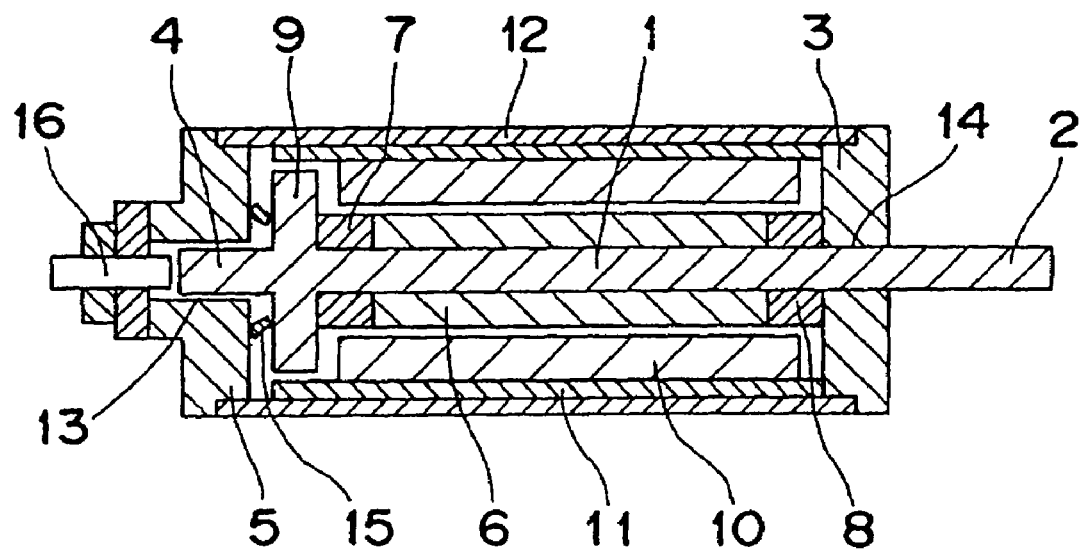
FIG. 1 is a front sectional view showing an actuator according to a first embodiment of the present invention.

Before the description of the present invention proceeds, it is to be noted that like parts are designated by like reference numerals throughout the accompanying drawings.

A first embodiment of the present invention will be described below with reference to FIG. 1.

FIG. 1 shows a direct-acting type actuator that employs a Giant-magnetostrictive element, in which a displacement sensor for detecting the position in the axial direction of an output shaft is arranged in an axial core portion located opposite to the output side.

The apparatus includes a piston (one example of an output shaft) 1 driven by the actuator, a front-side (output-side) end portion 2 of the piston 1, a front-side sleeve 3 that supports the front side of the piston 1, a rear-side end portion 4 of the piston 1, and a rear-side sleeve 5 that supports the piston 1 on the rear side. The apparatus further includes a Giant-magnetostrictive rod 6 that is made of a Giant-magnetostrictive material and has a cylindrical shape. This Giant-magnetostrictive rod 6 is fixed between a rear-side yoke 9 and the front-side sleeve 3 that concurrently serves as a yoke member with interposition of first and second bias permanent magnets 7 and 8, respectively, arranged on the left and right sides. In addition, a magnetic field coil 10 is provided for applying a magnetic field in the lengthwise direction of the Giant-magnetostrictive rod 6, and a cylindrical yoke 11 is housed in a housing 12.

The first and second permanent magnets 7 and 8 are provided for boosting the operating point of the magnetic field by preliminarily applying a magnetic field to the Giant-magnetostrictive rod 6. By virtue of this magnetic bias, the linearity of Giant-magnetostriction with respect to the intensity of the magnetic field can be improved. A closed-loop magnetic circuit for controlling the extension and contraction of the Giant-magnetostrictive rod 6 is formed through the route: the rod 6→the magnet 7→the yoke 9→the yoke 11→the magnet 8→the rod 6. That is, the members 6 through 11 constitute a Giant-magnetostrictive actuator that can control the amount of extension and contraction in the axial direction of the Giant-magnetostrictive rod 6 by a current given to the magnetic field coil.

It is to be noted that the permanent magnets for bias use may be arranged in any portions and any form so long as a closed-loop magnetic circuit can be formed, and the same thing can be said for any embodiment of the present invention.

The piston 1 also extends leftward integrally with the cylindrical rear-side yoke 9 and is housed in the rear-side sleeve 5. The rear side of the piston 1 is axially movably supported by a bearing portion 13. The front side of the piston 1 is also supported by a bearing portion 14.

Between the rear-side sleeve 5 and the yoke 9 is provided a bias spring 15 that applies a mechanical axial preload to the Giant-magnetostrictive rod 6. A compressive stress is consistently applied in the axial direction to the Giant-magnetostrictive rod 6 by this bias spring 15. Therefore, the drawback of the Giant-magnetostrictive element, which is vulnerable to a tensile stress when a repetitive stress is generated, is eliminated.

A displacement sensor 16 for detecting the position of the end surface of the piston 2 is arranged in an axial core portion located at the left-hand end of the rear-side sleeve 5 so as to be adjustable.

Figure 12:
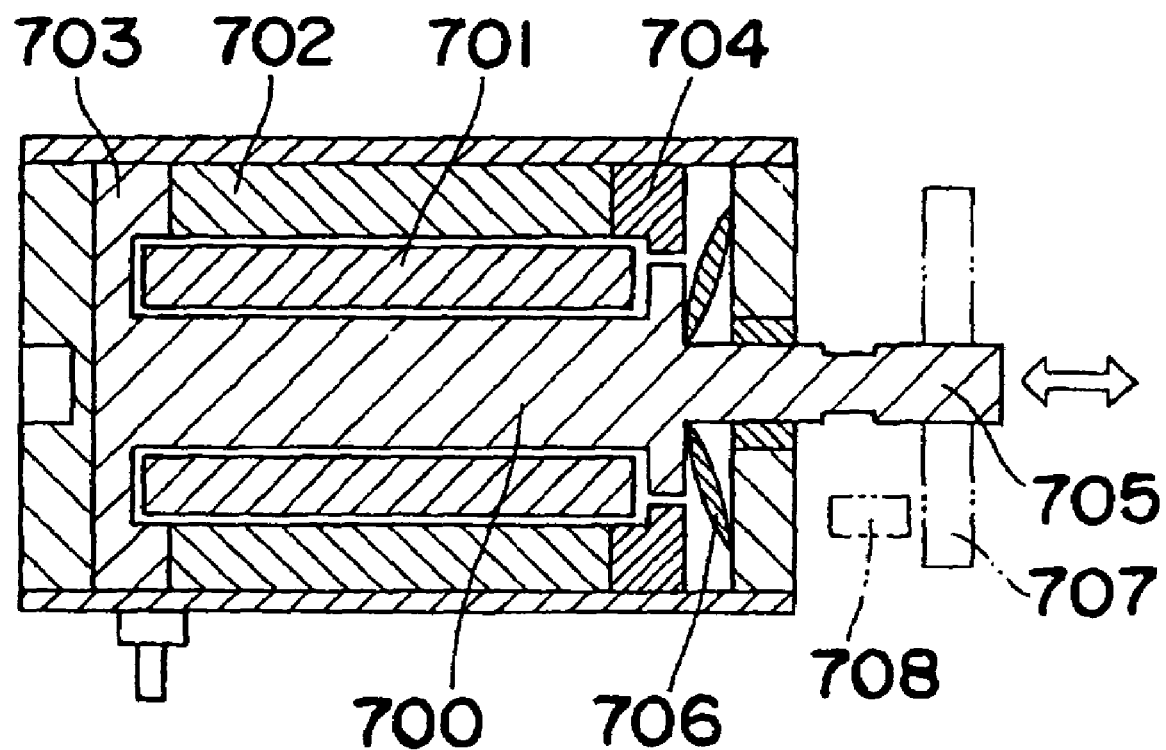
FIG. 12 is a front sectional view showing a prior art Giant-magnetostrictive actuator.

The prior art actuator (FIG. 12) of the electromagnetostrictive element has had a construction in which, for example, a ring 707 is mounted on the output side of an output shaft 705 and a displacement sensor 708 is arranged so as to detect the position in the axial direction of this ring 707 in order to detect the displacement of the output shaft 705. In this case, there has been a deficiency in that the detection accuracy is influenced by the inclination of the ring 707 with respect to the axial core or the like.

There have also been many issues of the sensor arrangement in the applications in which the output shaft is immersed in a fluid.

According to the first embodiment of the present invention, the displacement sensor is arranged in the axial core portion located on the side opposite to the output shaft side. In addition, as illustrated in FIG. 1, the displacement sensor 60 is located on the extended longitudinal axis of piston 1 so that the sensor 60 and piston 1 are coaxial. Therefore, the displacement of the output shaft can be detected with high accuracy. Furthermore, the length of the open end of the output shaft can be shortened, and this allows the whole device including the actuator to be constructed compact.

A second embodiment of the present invention will be described below.

Figure 2:
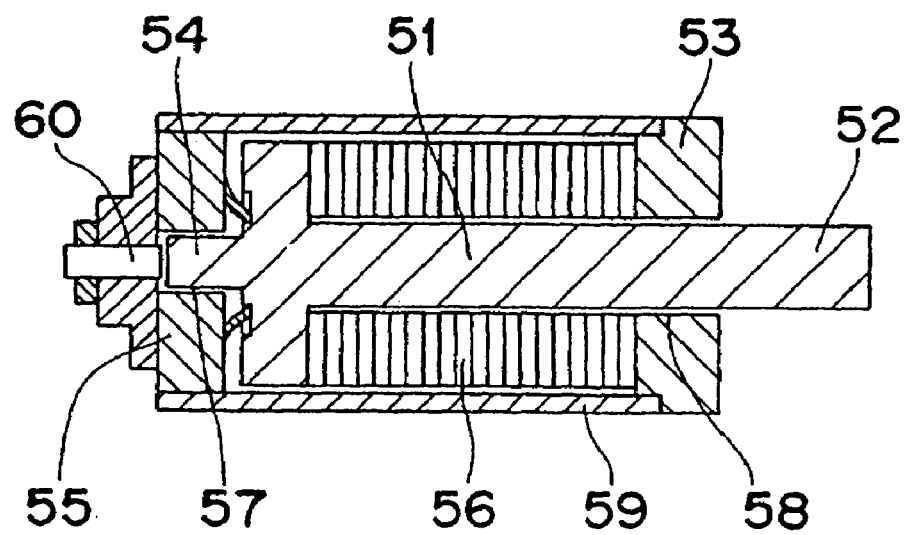
FIG. 2 is a front sectional view showing an actuator according to a second embodiment of the present invention.

FIG. 2 shows an application of the present invention employing an actuator of a laminate type piezoelectric element, which is an electromagnetostrictive element. This embodiment of the invention includes a piston (one example of an output shaft) 51 driven by the actuator, a front-side (output-side) end portion 52 of the piston 51, a front-side sleeve 53 for supporting the piston 51 on the front side, a rear-side end portion 54 of the piston 51, and a rear-side sleeve 55 for supporting the piston 51 on the rear side. A laminate-type piezoelectric element 56, which is formed into a hollow shape, is mounted between the rear side of the piston 51 and the front-side sleeve 53 that serves as a fixed side. The rear side 54 of the piston 51 is movably supported in the axial direction by a bearing portion 57. The front side of the piston 51 is also supported by a bearing portion 58. A housing 59 houses therein the members 51 through 56. A displacement sensor 60 for detecting the end surface position of the piston 51 is arranged in a center portion on the left-hand side of the rear-side sleeve 55 so as to be coaxial with piston 51 and so as to be adjustable.

The laminate type piezoelectric element can have a smaller outer diameter since no electromagnetic coil is necessary, although it has a shorter stroke as compared to the same length of the Giant-magnetostrictive element.

A third embodiment of the present invention will be described below.

According to this third embodiment, an actuator having two output shafts with a phase difference of 180 degrees is constructed by utilizing an output displacement at both end portions of a Giant-magnetostrictive rod, paying attention to the phenomenon that the entire Giant-magnetostrictive element extends or contracts in the direction of the magnetic field.

This embodiment of the invention includes a piston (one example of a first output shaft) 100, a front-side small-diameter section 101 of this piston 100, a movable sleeve (one example of second output shaft) 102 for supporting the small-diameter section 101 of the piston 100, a front-side sleeve 103 for supporting this movable sleeve 102 relatively movably in the axial direction, and a bearing portion 104. The invention also includes a housing 105 and a cylindrical Giant-magnetostrictive rod 106 made of a Giant-magnetostrictive material. This Giant-magnetostrictive rod 106 is fixed between an upper yoke 109 that concurrently serves as a yoke member and a lower yoke 110 with interposition of first and second bias permanent magnets 107 and 108 arranged on the upper and lower sides. A magnetic field coil 111 applies a magnetic field in the lengthwise direction of the Giant-magnetostrictive rod 106, and a cylindrical yoke 112 is housed in the housing 105.

Bias springs 114 and 115 for applying mechanical axial pressures to the Giant-magnetostrictive rod 106 are provided between the upper yoke 109 and an upper sleeve 113 and between the lower yoke 110 and the lower sleeve 103, respectively.

The actuator constructed as above has two output shafts whose displacement phases differ from each other by 180 degrees. With the construction shown in FIG. 3, an actuator with a dual-piston structure having two output shafts on an identical axis is provided. That is, the movable sleeve 102 is pushed outward when the piston 100 at the center axis is pulled inward, and the movable sleeve 102 is conversely pulled inward when the piston 100 is pushed outward. Taking advantage of this operation, the present actuator can be applied to a variety of applications.

FIGS. 4A through 4D show an application example (1) of the third embodiment of the present invention, in which the present actuator is used as a mounting use vacuum mounter of chip components in a surface mounting process.

Figure 3:
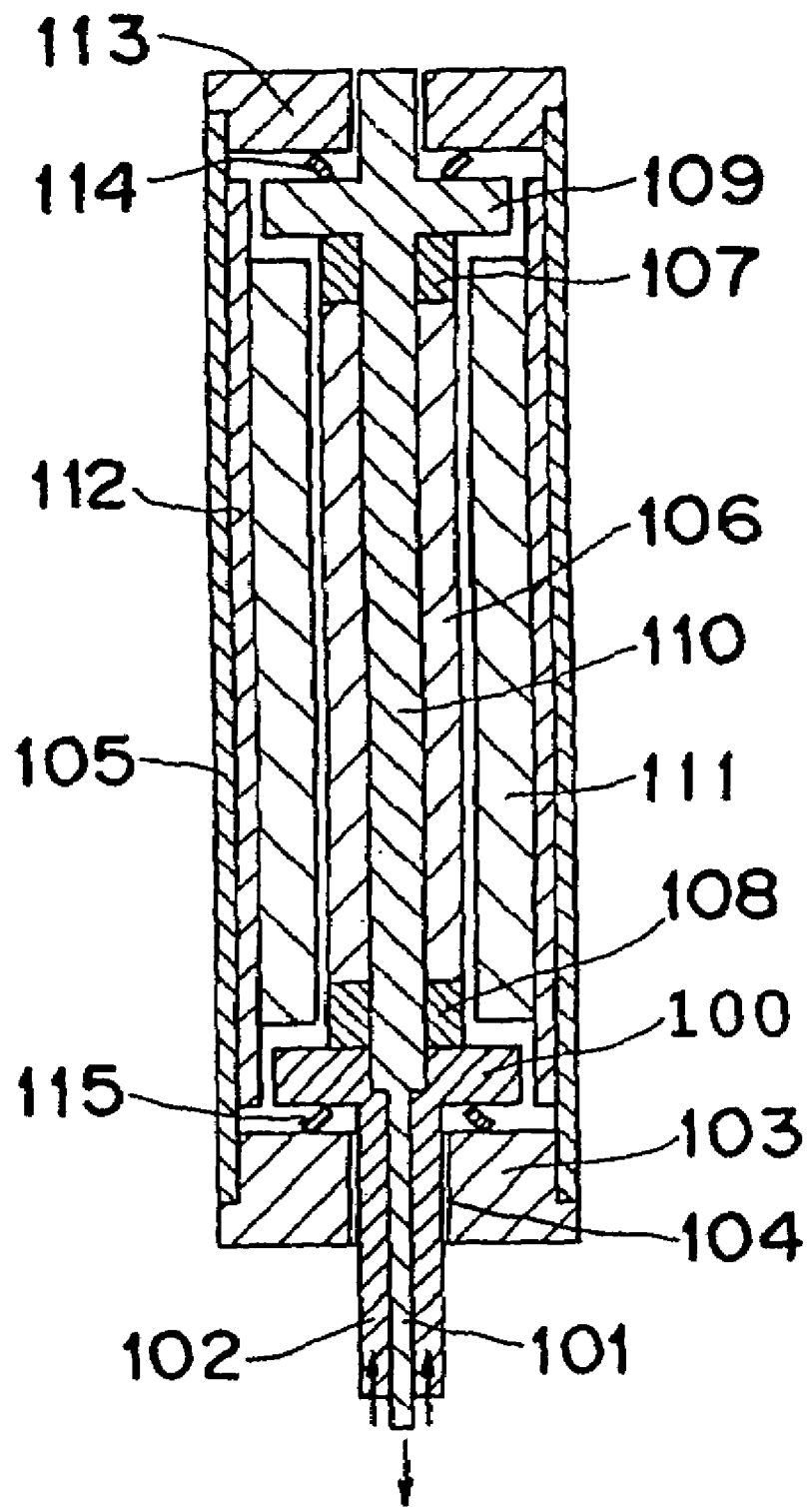
FIG. 3 is a front sectional view showing an actuator according to a third embodiment of the present invention.
Figure 4:
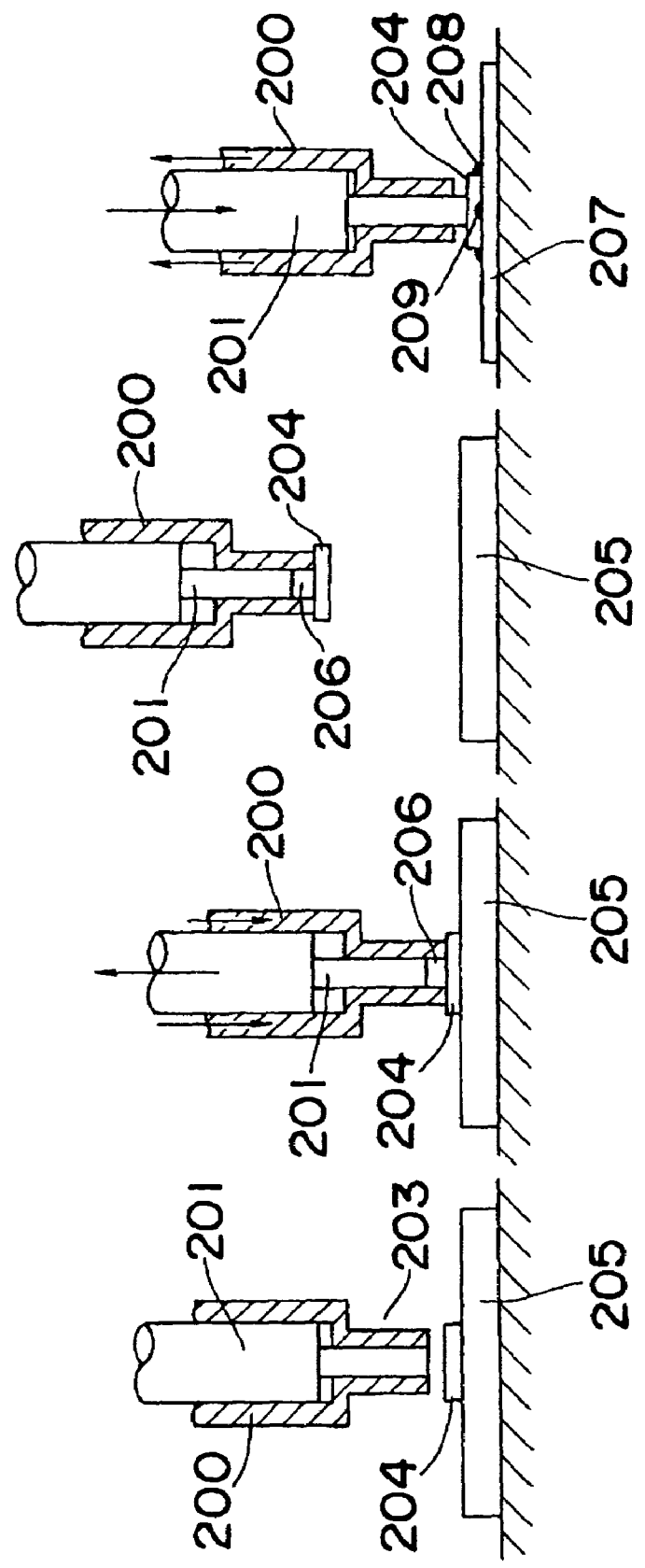
FIGS. 4A, 4B, 4C, and 4D are views showing an application example (1) of the third embodiment of the present invention.

The fore ends of a movable sleeve 200 (corresponding to the movable sleeve 102 in FIG. 3) and a piston 201 (corresponding to the piston 100 or the small-diameter section 101 in FIG. 3) are formed to have minimized outer diameters conforming to rectangular chip components. The rectangular chip components include, for example, thick film resistors, laminate ceramic capacitors, ceramic trimmer capacitors, and intack.

(1) In FIG. 4A, a suction head 203 constructed of the movable sleeve 200 and the piston 201 is arranged with a slight gap provided above a chip component 204. This chip component 204 is preliminarily positioned on a sheet 205 that can be slightly elastically deformed. In this stage, the axial positions of the end surfaces of both the movable sleeve 200 and the piston 201 are equal to each other, and no difference in level exists between the two in the axial direction.

(2) In FIG. 4B, the piston 201 is moved up concurrently with the descent of the movable sleeve 200. When the end surface of the movable sleeve 200 reaches the chip component 204, an airtight space 206 is formed by the movable sleeve 200, the piston 201, and the chip component 204.

This airtight space 206 is completely sealed from the outside by pressing the end surface of the movable sleeve 200 against the chip component 204. Due to the ascent of the piston 201, the pressure inside the airtight space 206 is reduced together with the increase in volume of the airtight space 206, by which the chip component 204 is sucked with the suction head 203.

(3) In this state, the chip component 204 is moved upwardly as shown in FIG. 4C.

(4) Solder pastes 208 and an adhesive 209 are preliminarily coated on a printed wiring board 207 on which the chip component 204 is to be mounted. The chip component 204 sucked with the suction head 203 is positioned on the printed wiring board 207, and thereafter, the movable sleeve 200 is moved up reverse to the aforementioned operation (2). At the same time, the piston 201 is moved down. Consequently, the airtight space 206 is opened to the atmosphere, and the chip component 204 is mounted on the wiring board 207.

The actuator employing an electromagnetostrictive element such as a Giant-magnetostrictive element, a piezoelectric element, or the like has a remarkably fast response and is able to obtain a response on the order of $10^{-4}$ sec (0.1 msec). Therefore, the movable sleeve 200 and the piston 201 of the present third embodiment can obtain an extremely high operating speed. Moreover, since the suction head 203 uses the relative movement of the movable sleeve 200 and the piston 201, the process of sucking the chip component 204 is allowed to have high response without the interposition of pneumatic piping.

By contrast, in the case of the conventional mounting system that employs a voice coil system, a solenoid system, or the like of the electromagnetic type as a drive source, the response is degraded by two or more orders of magnitude. Moreover, it is necessary to perform vacuum suction by means of a vacuum source arranged externally, and the delay of the response of the pneumatic valves and the piping system has been a serious bottleneck hindering the increase in speed.

Due to vacuum mounter to which the aforementioned Giant-magnetostrictive actuator is applied, the chip component mounting process during the surface mounting can be achieved in extremely rapid motions.

FIGS. 5A through 5D are views showing an application example (2) of the third embodiment of the present invention, in which the actuator of the present invention is used as a micro dispenser.

By utilizing the two output shafts that have a phase difference of 180 degrees and belong to the actuator, a positive displacement system pump can be constructed. This enables the provision of a high-speed dispenser for supplying a constant amount of high-viscosity fluid.

A piston 250 (corresponding to the piston 100 or the small-diameter section 101 in FIG. 3), a movable sleeve 251 (corresponding to the movable sleeve 102 in FIG. 3), a housing 252, a discharge nozzle 253, a pump chamber 255 formed of the aforementioned members 250, 251, and 252, and a transport fluid 254, which is pressurized by a pressure source provided externally and sealed in a pump chamber 255, are provided.

Figure 5:
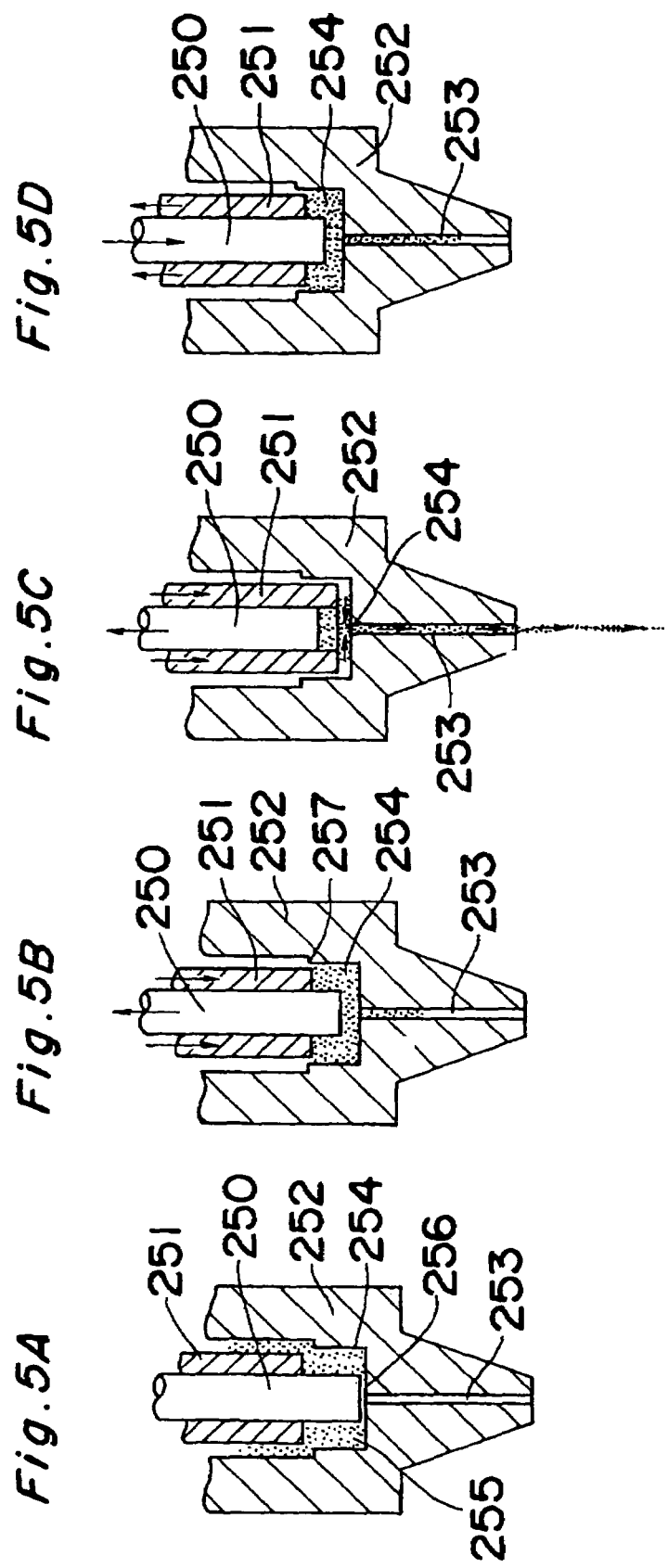
FIGS. 5A, 5B, 5C, and 5D are views showing an application example (2) of the third embodiment of the present invention.

(1) FIG. 5A shows a state immediately before the start of a discharge process. The piston 250 is located in the lowermost position, and an opening 256 located on the pump chamber 255 side of the discharge nozzle 253 is sealed by the end surface of the piston 250. A fluid path extending from the fluid supply side to the pump chamber 255 is opened.

(2) When the movable sleeve 251 starts to move down in FIG. 5B, and a seal portion 257 is formed between the outer peripheral portion of the movable sleeve 251 and the inner surface of the housing 252. Consequently, the pump chamber 255 is shielded from the supply side. The piston 250 also moves up at the same time. Since the sectional area $S_2$ of the movable sleeve 251 is dimensionally set to be sufficiently larger than the sectional area $S_1$ of the piston 250 so that $S_2 > S_1$, the pressure inside the pump chamber 255 is increased.

(3) Assuming that the piston 250 has a displacement $X_2$ and the movable sleeve 251 has a displacement $X_1$ in FIG. 5C, since the present dispenser is a positive displacement system, a discharge amount Q becomes $Q = S_2 X_2 - S_1 X_1$ in the discharge process. Therefore, according to the characteristic of the positive displacement system, a specified discharge amount can be obtained which does not depend on the viscosity of the fluid, the nozzle diameter, and the like.

(4) In FIG. 5D, the movable sleeve 251 moves up when the discharge ends, and the piston 250 moves down again to the lowermost position. At this time, a pump chamber 254 momentarily has a negative pressure, and there is a concern about a backward flow from the discharge nozzle 253 side to the pump chamber 255.

Assuming that a time of the descent of the piston 250 to the lowermost position from the end of discharge is $\Delta t$, a fluid resistance of the discharge nozzle 253 is R, a flow rate of the backward flow is $\Delta Q$, and a pressure difference is $\Delta P$, then $\Delta Q = (\Delta P/R) \times \Delta t$.

Since the above dispenser employing the electromagnetostrictive element of the Giant-magnetostrictive element, the piezoelectric element, or the like has a response of $10^{-4}$ to $10^{-3}$ sec, $\Delta t$ can be sufficiently reduced. Moreover, the absolute value of the negative pressure $\Delta P$ does not become equal to or greater than 1 kg/cm², and therefore, $\Delta Q$ is sufficiently small. This means that $Q >> \Delta Q$, and the backward flow does not incur a serious problem.

As described above, by employing the actuator of the present embodiment, there can be provided a dispenser capable of supplying a high-viscosity fluid with an extremely high response taking advantage of the features of the high speed and high generated load of the electromagnetostrictive element and the constant discharge of the positive displacement system pump.

A fourth embodiment of the present invention will be described below. Similarly to the third embodiment, this fourth embodiment has two output shafts utilizing the output displacement at both end portions of a Giant-magnetostrictive rod, and additionally provides the output shafts with a rotational function by means of a motor taking advantage of the feature of the Giant-magnetostrictive element that can be supplied with power in a non-contact manner.

Figure 6:
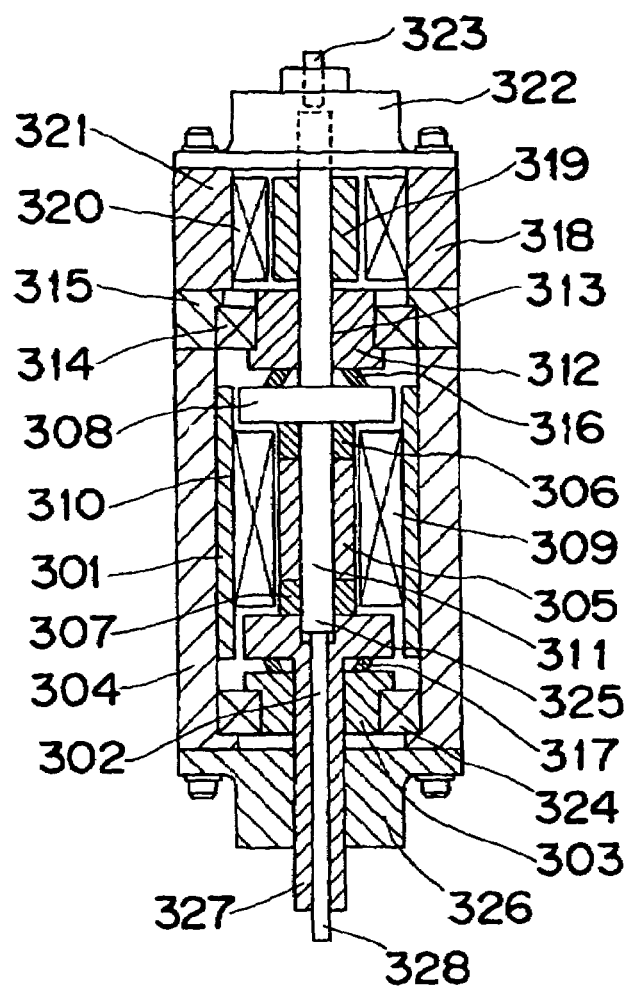
FIG. 6 is a front sectional view showing an actuator according to a fourth embodiment of the present invention.

In FIG. 6 is shown a direct-acting type actuator 301 of a Giant-magnetostrictive element. The apparatus includes a movable sleeve (one example of second output shaft) 302 driven by the actuator 301, a rotary sleeve 303 that houses therein the movable sleeve 302 on the front side, and a housing 304 that houses therein the actuator 1. A cylindrical Giant-magnetostrictive rod 305 is made of a Giant-magnetostrictive material. This Giant-magnetostrictive rod 305 is fixed between an upper yoke 308 and the movable sleeve 302 that concurrently serves as a yoke member with interposition of first and second bias permanent magnets 306 and 307 arranged on the upper and lower sides. A magnetic field coil 309 is provided for applying a magnetic field in the lengthwise direction of the Giant-magnetostrictive rod 305, and a cylindrical yoke 310 is housed in the housing 304.

A magnetic field coil 309 is provided for applying a magnetic field in the lengthwise direction of the Giant-magnetostrictive rod 305, and a cylindrical yoke 310 housed in the housing 304.

The first and second permanent magnets 306 and 307 are provided for boosting the operating point of the magnetic field by preliminarily applying a magnetic field to the Giant-magnetostrictive rod 305. A closed-loop magnetic circuit for controlling the extension and contraction of the Giant-magnetostrictive rod 305 is formed through the route of: the rod 305→the magnet 306→the yoke 308→the yoke 310→the movable sleeve 302→the magnet 307→the rod 305. That is, the members 305 through 310 constitute a Giant-magnetostrictive actuator 301 that can control the extension and contraction in the axial direction of the Giant-magnetostrictive rod 305 by a current given to the magnetic field coil.

A piston (one example of first output shaft) 311 is integrally fixed to the upper yoke 308 (made of magnetic material) and provided through the Giant-magnetostrictive rod 305. This piston 311 adheres closely to the upper end of the Giant-magnetostrictive rod 305 with interposition of the first bias permanent magnet 306. The piston 311 also extends upward and is supported by the upper end of a bearing portion 313 provided for the upper sleeve 312. This upper sleeve 312 is rotatably supported by an intermediate housing 315 via a ball bearing 314.

The movable sleeve 302 adheres closely to the lower end of the Giant-magnetostrictive rod 305 with interposition of the second bias permanent magnet 307, similarly to the piston 311.

Bias springs 316 and 317 for applying a mechanical axial preload to the Giant-magnetostrictive rod 305 are provided between the upper yoke 308 and the upper sleeve 312, and between the movable sleeve 302 and the rotary sleeve 303, respectively.

With the above-mentioned construction, if a current is applied to the electromagnetic coil 309 of the Giant-magnetostrictive element, then the Giant-magnetostrictive rod 305 extends or contracts in proportion to the magnitude of the applied current. At this time, the displacement of both end portions of the Giant-magnetostrictive rod 305 is determined depending on the magnitude of stiffness of the two bias springs 316 and 317 that apply the axial preload to the Giant-magnetostrictive rod 305. Therefore, when changing the stroke of the movable sleeve 302 and the piston 311, it is proper to change the stiffness ratio between the two bias springs 316 and 317.

If the stiffness of one of the bias springs is made infinite, i.e., if one of the bias springs is removed to integrate the two components (of the combination of the movable sleeve 302 and the rotary sleeve 303 or the combination of the yoke 308 and the sleeve 312) arranged with interposition of the spring, then there is one axial output shaft.

The piston 311 penetrates the cylindrical upper sleeve 312 and further extends upward. A motor 318 gives a rotary motion to the piston 311 comprises a DC servomotor in the embodiment. A motor rotor 319, a motor stator 320, and an upper housing 321 that houses therein the motor stator 320 are also provided.

An encoder 322 for detecting the rotational information of the piston 311 is provided above the upper housing 321. A displacement sensor 323 for detecting the end surface position of the piston 311 is further arranged in a center portion above the encoder 322.

The rotary sleeve 303 that houses therein a part of the discharge side of the movable sleeve 302 is rotatably supported by a ball bearing 324 provided between the sleeve 303 and the housing 304. A joint portion 325 is formed between the movable sleeve 302 and the piston 311.

Figure 7:
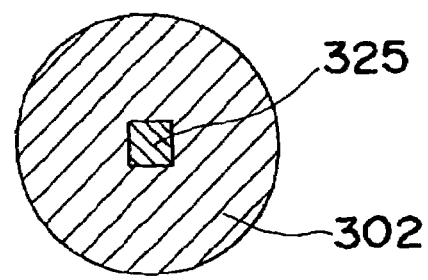
FIG. 7 is a section view showing a joint portion of the above embodiment.

A rotary motion given from the motor 318 to the piston 311 is given to the movable sleeve 302 by the joint portion 325 of the movable sleeve 302 and the piston 311, as shown in FIG. 7. In short, there is a joint configuration (rectangular cross-section shape) such that the piston 311 transmits only rotation to the movable sleeve 302 with a relative rectilinear motion set free.

It is to be noted that the piston 311, which is made of a nonmagnetic material, exerts no influence on the closed-loop magnetic circuit for controlling the extension and contraction of the Giant-magnetostrictive rod 305. Moreover, a driving torque given from the motor 318 is transmitted only to the piston 311. Therefore, no torsional stress is generated in the Giant-magnetostrictive rod 305. Moreover, a gap between the Giant-magnetostrictive rod 305 and the piston 311 is made sufficiently small, so that no bending stress is generated in the Giant-magnetostrictive rod 305. With these devices, the reliability and durability of the Giant-magnetostrictive rod 305, which is formed of a fragile material with respect to the tensile stress, can be secured.

A lower housing 326 is provided for supporting the movable sleeve 302 on the front side, a first output shaft 327 of the movable sleeve 302, and a second output shaft 328 of the piston 311.

With the aforementioned construction, in the fluid supply unit of the present fourth embodiment, the movable sleeve 302 and the piston 311 can concurrently independently perform the control of the rotary motion and the rectilinear motion of a minute displacement.

Furthermore, in this fourth embodiment, the Giant-magnetostrictive element is employed as the direct-acting type actuator 301. Therefore, power for providing the rectilinear motion of the Giant-magnetostrictive rod 305 (and the movable sleeve 302 and the piston 311) can be externally provided in a noncontact manner. That is, according to the actuator of the present construction, the two output shafts can be moved relatively in the axial direction with high response taking advantage of the feature of the electromagnetostrictive element that has a frequency characteristic of several megahertz while performing the rotation of the motor.

Although the motor is arranged above the actuator 301 (Giant-magnetostrictive element) in the fourth embodiment, the reverse arrangement is also acceptable.

Figure 8:
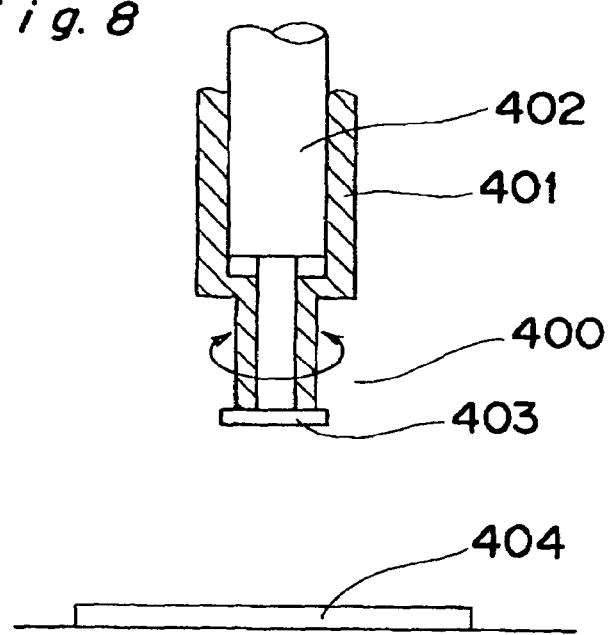
FIG. 8 is a view showing an application example (1) of the fourth embodiment of the present invention.

FIG. 8 shows an application example (1) of the fourth embodiment of the present invention, in which a rotational function is added to the suction head of the chip component mounting use vacuum mounter adopted by the third embodiment.

A suction head 400, a movable sleeve 401 (corresponding to the movable sleeve 302 or the first output staff 327 in FIG.

6), a piston 402 (corresponding to the piston 311 or the second output shaft 328 in FIG. 6), a chip component 403 (corresponding to the chip component 204 in FIG. 4), and a wiring board 404 are provided.

The suction head 400 to which the present actuator is applied can position the chip component sucked at an arbitrary angle through its rotation in addition to the function of sucking the chip component at high speed. Therefore, the chip component can be mounted on the board in an arbitrary posture.

Figure 9:
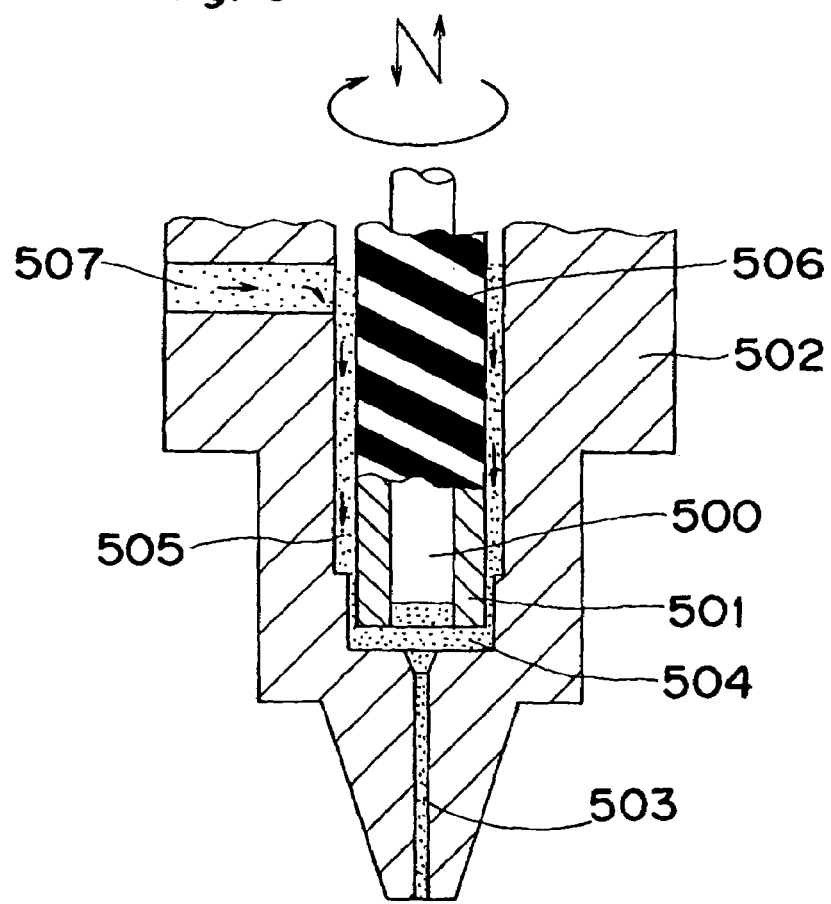
FIG. 9 is a view showing an application example (2) of the fourth embodiment of the present invention.

FIG. 9 shows an application example (2) of the fourth embodiment of the present invention, in which a dispenser provided with a thread groove is constructed by adding a rotational function to the micro pump adopted by the third embodiment. A piston 500 (corresponding to the piston 311 or the second output shaft 328 in FIG. 6), a movable sleeve 501 (corresponding to the movable sleeve 302 or the first output shaft 327 in FIG. 6), a housing 502, a discharge nozzle 503, a pump chamber 504 formed by the members 500, 501, and 502, a transport fluid 505 pressurized by a pressure source arranged externally, a thread groove 506 (the thread groove portion is painted black in the figure) formed on the relative movement surface of an outer surface 506 of the movable sleeve 501 and the inner surface of the housing 502, and an inlet 507 are provided.

If the pressure source of the transport fluid is constructed of air piping normally installed in a factory, then the upper limit value of the pressure becomes about 5 kg/cm$_2$. If a thread groove pump is used, then a pressure of tens to hundreds of kilograms per square centimeters can be generated comparatively easily. This arrangement is advantageous particularly to the coating of a high-viscosity fluid.

By applying the present invention, there can be provided a dispenser that enables not only the intermittent coating of a high-viscosity fluid such as adhesive, solder paste, fluorescent paint (for example, used for CRT), electrode formation for PDP, or the like with high response, but also the high-speed interruption and release of the fluid after continuous coating.

In the aforementioned application example, the thread groove pump is constructed by utilizing the rotation of the piston, and serves as the pressure source of the transport fluid. Instead of this method, it is acceptable to construct an inlet and delivery valve by utilizing the rotation of the piston for the provision of a positive displacement type pump with a combination of the opening and closing of this valve and the axial motion of the piston. In this case, the motor may be an oscillating motor as used for a scanning motor in place of the normal unidirectional motor.

Figure 10:
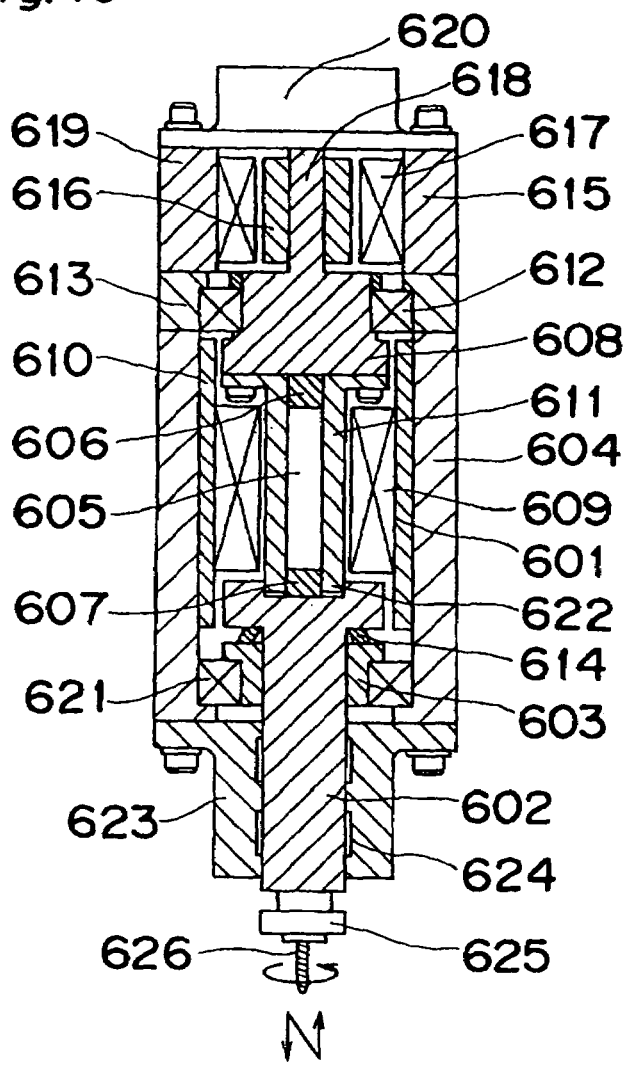
FIG. 10 is a front sectional view showing an actuator according to a fifth embodiment of the present invention.

A fifth embodiment of the present invention will be described below. FIG. 10 shows an actuator, which is similar to that of the fourth embodiment in that the output shaft is provided with a rotational function, and in which one of the two output shafts is fixed and the other one is made to move in a rectilinear motion of high rigidity. The following will describe an application example in which this actuator is applied to a spindle for oscillation processing (cutting scrap dividing) use.

A direct-acting type actuator has a Giant-magnetostrictive element. A piston (one example of an output shaft) 602 driven by an actuator 601, a rotary sleeve 603 that houses therein this piston 602 rotatably while permitting a relative rectilinear motion, a housing 604 that houses therein the actuator 601, and a Giant-magnetostrictive rod 605 constructed of a Giant-magnetostrictive material are provided. This Giant-magnetostrictive rod 605 is fixed between an upper sleeve 608 (rear-side center shaft) that concurrently serves as a yoke member and the piston 602 with interposition of first and second bias permanent magnets 606 and 607 arranged on the upper and lower sides. A magnetic field coil 609 is provided for applying a magnetic field in the lengthwise direction of the Giant-magnetostrictive rod 605, and a cylindrical yoke 610 is housed in the housing 604.

The first and second permanent magnets 606 and 607 are provided for boosting the operating point of the magnetic field by preliminarily applying a magnetic field to the Giant-magnetostrictive rod 605. A closed-loop magnetic circuit for controlling the extension and contraction of the Giant-magnetostrictive rod 605 is formed through the route: the rod 605→the magnet 606→the sleeve 608→the yoke 610→the piston 602→the magnet 607→the rod 605. That is, the members 605 through 610 constitute a Giant-magnetostrictive actuator 601 that can control the extension and contraction in the axial direction of the Giant-magnetostrictive rod 605 by a current given to the magnetic field coil 609.

There is provided a rotation transmitting sleeve 611 that is integrated with the upper sleeve 608 and that is provided with the Giant-magnetostrictive rod 605 housed therein.

The upper yoke 608 is rotatably supported by an intermediate housing 613 via a ball bearing 612. Between the piston 602 and the rotary sleeve 603 is provided a bias spring 614 for applying a mechanical axial preload to the Giant-magnetostrictive rod 605. A motor 615 gives a rotary motion to the piston 602 and comprises a DC servomotor in the fifth embodiment. In addition, a motor rotor 616, a motor stator 617, a motor rotary shaft 618 integrated with the upper sleeve 608, and an upper housing 619 that houses therein the motor stator 617 are also provided.

An encoder 620 for detecting the rotational information of the motor rotary shaft 618 is provided above the upper housing 619. The rotary sleeve 603 that houses therein a part of the piston 602 is rotatably supported by a ball bearing 621 provided between the sleeve 603 and the housing 604.

Figure 11:
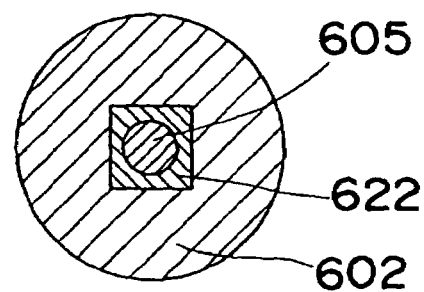
FIG. 11 is a view showing a joint portion of the above embodiment.

FIG. 11 shows a joint portion 622 of the rotation transmitting sleeve 611 and the piston 602. A rotary motion transmitted from the motor 615 to the rotation transmitting sleeve 611 is transmitted to the piston 602 by the joint portion 622 of the rotation transmitting sleeve 611 and the piston 602 as shown in FIG. 11. In short, the joint portion 622 has a joint configuration (rectangular cross-section shape) such that the piston 602 transmits only rotation to the rotation transmitting sleeve 611 with a relative rectilinear motion set free (dissipated).

It is to be noted that the rotation transmitting sleeve 611, which is made of a nonmagnetic material, exerts no influence on the closed-loop magnetic circuit for controlling the extension and contraction of the Giant-magnetostrictive rod 605. Moreover, a driving torque transmitted from the motor 615 is transmitted only to the rotation transmitting sleeve 611. Therefore, no torsional stress is generated in the Giant-magnetostrictive rod 605. Moreover, a gap between the Giant-magnetostrictive rod 605 and the rotation transmitting sleeve 611 is made sufficiently small, so that no bending stress is generated in the Giant-magnetostrictive rod 605. With these devices, the reliability and durability of the Giant-magnetostrictive rod 605, which is a fragile material with respect to the tensile stress, can be secured.

Moreover, it is acceptable to employ a Giant-magnetostrictive rod having a hollow shape and to provide this hollow portion with a center shaft for transmitting the rotation of the motor.

A lower housing 623 supports the piston 602 on the front side. The actuator of the present embodiment is used as a spindle for oscillation processing (cutting scrap dividing)

use. A static bearing 624 is arranged between the piston 602 and the lower housing 623 in order to support the piston 602 (corresponding to the main shaft of the spindle) with high rigidity. A tool holder 625 and a tool (i.e., machining tool) 626 are also provided.

With the present actuator, the tool 626 can be oscillated in the axial direction with an arbitrarily selected oscillatory waveform while keeping timing with the rotational position of the tool 626.

A variety of forms of oscillation processing have been developed. For instance, taking a drilling process as an example, it has been discovered that the cutting scraps are divided into small pieces, and the damage from the drill can be avoided if the oscillation is effected in the feed direction of the tool 626 and processing conditions are appropriately selected. As an example of research, there is "Research on Small-Diameter Hole Processing with Oscillation Superimposed on Feed" by Kubota, et al., VOL. 61, No. 7, 1995 of The Journal of Japan Society for Precision Engineering.

The above-mentioned research discloses that the phase difference between the cutting blades exerts significant influence on the generation of cutting scraps by superimposing oscillation on the feed, and the cutting scraps are divided by appropriately selecting the number of vibration waves per rotation of the drill. In order to achieve this processing method, a means or a device is provided for oscillating the drill and the workpiece relative to each other in the axial direction while maintaining a timing with the rotation of the drill.

The aforementioned example of research introduces a method of transmitting oscillation to the workpiece in the direction of feed by providing a PZT actuator on the fixed side where the workpiece is held, instead of providing an oscillation source on the spindle side. However, if it is attempted to obtain effects of the oscillation processing on the actual site of mass-production, the application of oscillation to the workpiece has many troubles in terms of production efficiency and lacks versatility.

If the actuator of the present embodiment is adopted as a processing spindle for achieving the aforementioned processing method, then the cutting scrap dividing process can be achieved by taking advantage of the feature of the Giant-magnetostrictive element with the main shaft supported with high accuracy and high rigidity.

It is possible to internally provide the spindle with a mechanism for oscillating the drill in the axial direction by transforming the rotary motion into a motion in the axial direction utilizing the rotation of the spindle main shaft. However, in this case, there is no versatility regarding the timing and so on with respect to the oscillation frequency, oscillation waveform, rotational frequency, and rotational position.

If the actuator of the present embodiment is employed, then a cutting scrap dividing spindle, which can execute control of displacement and speed with a high degree of freedom by a synchronous operation of the Giant-magnetostrictive element and the motor and which has versatility in use for a variety of purposes, can be provided. For example, the spindle can be used for forming a small-diameter hole (for example, ϕ0.1 mm or less) through a printed wiring board of high density.

The processing methods to which the actuator of the present invention can be applied include not only the drilling process but also the processes of cutting, turning, grinding, polishing, milling, and the like. Taking advantage of the Giant-magnetostrictive element that can be driven on the level of high-frequency supersonic oscillation, the present actuator can also be applied to so-called pulse cutting, by which the processing resistance is reduced by producing high-frequency oscillations in the direction of cutting. If a torsional oscillator is provided in the portion where the motor is to be installed in place of the normal motor of unidirectional rotation, then a spindle for the so-called screw oscillation processing can also be achieved with the combination of the axial oscillation and the torsional oscillation.

The present actuator can be applied to a variety of uses such as a high-accuracy electrode holding device capable of increasing the processing efficiency, otherwise by concurrently transmitting oscillation and rotation to the electrodes of micro discharge processing, and so on.

By means of the actuator to which the present invention is applied, a mechanical unit that has a complex operation with a high degree of freedom can be provided with a very simple construction, also taking advantage of the features of the small size, high accuracy, high generated load, high-speed response, and so on of the electromagnetostrictive element.

If the actuator of the present invention is used for, for example, a dispenser for surface mounting, fluorescent substance coating on a display surface, a chip mounter, an oscillation processing spindle, and the like, the advantages of the actuator can be fully appreciated, producing enormous effects.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An actuator comprising:
an electromagnetostrictive element having a first end located on a front side and a second end located on a rear side;
a rear-side center shaft pressurized toward the rear side of the electromagnetostrictive element;
a rear-side bearing portion provided between the rear-side center shaft and a housing to make the rear-side center shaft rotatable relative to the housing;
an output shaft pressurized toward the front side of the electromagnetostrictive element;
a front-side sleeve rotatably supporting the output shaft relative to the housing; and
a front-side bearing portion supporting the output shaft rotatably relative to the housing and movably in the axial direction, said front-side bearing portion including:
a bearing member arranged at a rear side of the output shaft near the electromagnetostrictive element; and
a radial bearing member arranged at a front side of the output shaft between the housing and the output shaft.

2. An actuator as claimed in claim 1, further comprising a rotation transmission shaft capable of moving relatively in the axial direction and mutually transmitting rotation which is provided between the front side and the rear side of the electromagnetostrictive element.

3. An actuator as claimed in claim 1, further comprising a bias spring provided between the output shaft and the front-side sleeve.

4. An actuator as claimed in claim 1, wherein the electromagnetostrictive element is a Giant-magnetostrictive element.

5. An actuator as claimed in claim 1, wherein the radial bearing member comprises a static bearing.

6. An actuator as claimed in claim 1, further comprising a machining tool mounted on an end located on the front side of the output shaft.

* * * * *